(12) United States Patent
Baek et al.

(10) Patent No.: US 9,203,407 B2
(45) Date of Patent: Dec. 1, 2015

(54) SEMICONDUCTOR DEVICE AND METHOD FOR DETECTING STATE OF INPUT SIGNAL OF SEMICONDUCTOR DEVICE

(71) Applicant: SK hynix Inc., Gyeonggi-do (KR)

(72) Inventors: Seung-Geun Baek, Gyeonggi-do (KR); Hoon Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 22 days.

(21) Appl. No.: 14/106,828

(22) Filed: Dec. 15, 2013

(65) Prior Publication Data
US 2015/0102838 A1   Apr. 16, 2015

(30) Foreign Application Priority Data
Oct. 14, 2013   (KR) .................. 10-2013-0121898

(51) Int. Cl.
| | | |
|---|---|---|
| H03K 19/00 | (2006.01) |
| G11C 7/00 | (2006.01) |
| H03K 19/003 | (2006.01) |
| H03K 5/135 | (2006.01) |
| G11C 7/10 | (2006.01) |
| H04L 7/00 | (2006.01) |
| H03K 5/1536 | (2006.01) |

(52) U.S. Cl.
CPC ............ *H03K 19/003* (2013.01); *G11C 7/1093* (2013.01); *H03K 5/135* (2013.01); *H03K 5/1536* (2013.01); *H04L 7/0008* (2013.01)

(58) Field of Classification Search
CPC ... H03K 5/135; H03K 5/1536; H03K 3/0375; H03K 3/3565; H03K 3/356121; H03K 3/356156; H03K 19/01707; H03K 19/01728; G11C 7/1093; G11C 29/46; H04L 7/02; H04L 7/0008; H04L 7/0338; H04L 7/033; H04L 25/14
USPC .................. 326/93, 94; 327/141, 52
See application file for complete search history.

(56) References Cited

U.S. PATENT DOCUMENTS

| | | | | |
|---|---|---|---|---|
| 4,498,176 A * | 2/1985 | Wagner | .......................... | 714/798 |
| 4,575,644 A * | 3/1986 | Leslie | ............................ | 327/198 |
| 6,498,513 B1 * | 12/2002 | Reynolds | ........................ | 326/94 |
| 6,707,723 B2 * | 3/2004 | Jeong | ....................... | 365/189.05 |
| 6,781,418 B1 * | 8/2004 | Reynolds | ........................ | 326/94 |
| 6,906,555 B2 * | 6/2005 | Ma | .................................. | 326/94 |
| 6,927,604 B2 * | 8/2005 | Boerstler et al. | ................ | 326/93 |
| 6,943,595 B2 * | 9/2005 | Sugimoto et al. | ............. | 327/141 |
| 7,183,792 B2 * | 2/2007 | Marr | ................................ | 326/16 |
| 8,537,628 B2 * | 9/2013 | Kim et al. | ..................... | 365/201 |
| 2007/0164778 A1 * | 7/2007 | Marr | ............................... | 326/16 |

FOREIGN PATENT DOCUMENTS

| | | |
|---|---|---|
| KR | 100964920 | 6/2010 |
| KR | 1020100058347 | 6/2010 |

* cited by examiner

*Primary Examiner* — Vibol Tan
(74) *Attorney, Agent, or Firm* — IP & T Group LLP

(57) ABSTRACT

A semiconductor device includes a signal detection unit suitable for detecting a state of an input signal and generating a detection signal based on a detected result, and a signal transmission unit suitable for selectively transmitting the input signal in response to the detection signal, wherein the signal detection unit includes a state signal generation unit suitable for detecting a level shifting time of the input signal, and generating a state signal at a detected level shifting time, and a state determination unit suitable for comparing a voltage level of the input signal with a voltage level of a reference voltage in response to the state signal, and outputting the detection signal.

18 Claims, 8 Drawing Sheets

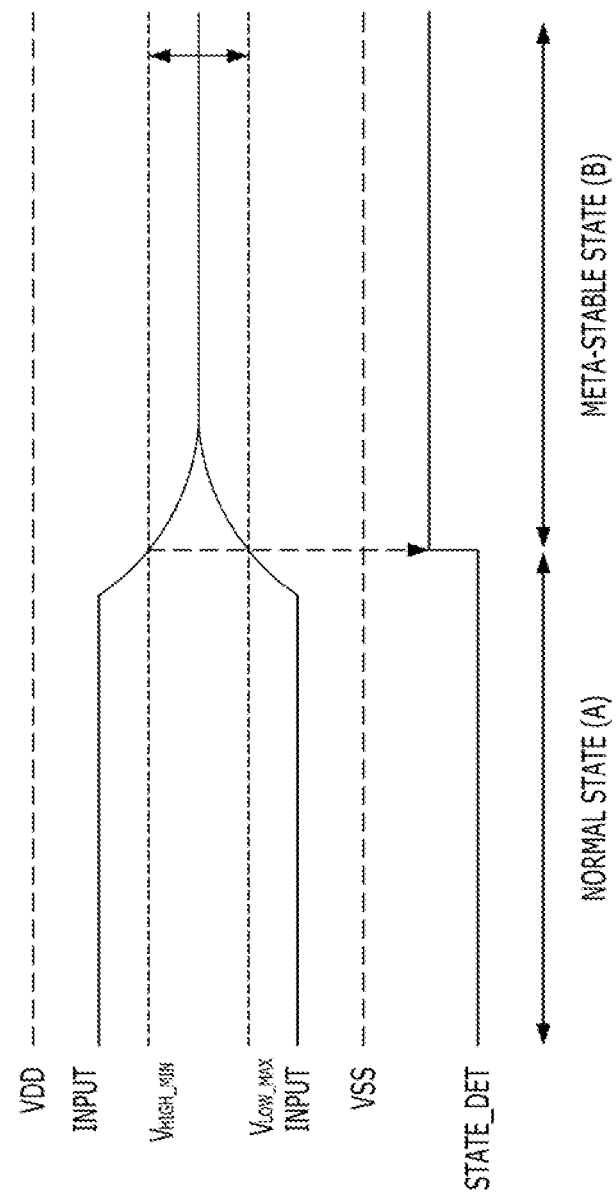

SEMICONDUCTOR DEVICE AND METHOD FOR DETECTING STATE OF INPUT SIGNAL OF SEMICONDUCTOR DEVICE

CROSS-REFERENCE TO RELATED APPLICATIONS

The present application claims priority of Korean Patent Application No. 10-2013-0121898, filed on Oct. 14, 2013, which is incorporated herein by reference in its entirety.

BACKGROUND

1. Field

Exemplary embodiments of the present invention relate to a semiconductor design technology, and more particularly, to a semiconductor device including a detection circuit for detecting a state of an input signal.

2. Description of the Related Art

A signal input of a semiconductor device such as a dynamic random access memory (DRAM) is performed using a clock signal of a system including the semiconductor device. If the clock signal is changed by an internal noise or an external noise, an accurate signal may not be inputted to the semiconductor device. Moreover, if an input signal does not have a sufficient margin to be synchronized with the clock signal, the input signal may not be accurately inputted to have an influence on an output signal. Since such an output signal of a logic circuit is not identified in a typical system configuration, another logic circuit using the output signal as an input signal may malfunction. It is referred to as 'metastable state' the output signal of which is not determined as a logic high level or a logic low level.

FIG. 1A is a circuit diagram illustrating an output circuit having a plurality of synchronization units, and FIG. 1B is a timing diagram explaining a metastable state of the output circuit shown in FIG. 1A.

Referring to FIG. 1A, the output circuit includes a plurality of synchronization units, which are serially coupled to each other. The plurality of synchronization units receive an input signal and a clock signal CLK, synchronize the input signal with the clock signal CLK, and output a synchronized input signal as an output signal. As the input signal, the first one of the plurality of synchronization units receives an input signal INPUT and the others receive an output signal of the preceding one. If an output signal outputted from the last one of the plurality of synchronization units is a final output signal OUT, a metastable state may occur in the input signal INPUT due to a relative timing margin on a rising edge of the clock signal to the input signal of each of the plurality of synchronization units. For example, in case of a rising-edge triggered flip-flop, an input signal INPUT maintains a data value for a certain time before and after a rising edge of the clock signal CLK. Herein, a data maintaining time prior to the rising edge time of the clock signal CLK is referred to as a setup time, and a data maintaining time posterior to the rising edge time of the clock signal CLK is referred to as a hold time.

Referring to FIG. 1B, an occurrence cause of a metastable state may be recognized from a wave form depending on the input signal INPUT. In case of (a) and (b), a margin is over than the setup time and the hold time. If the input signal having a logic high level is inputted, an output signal of the synchronization unit has a logic high level. If the input signal having a logic low level is inputted, the output signal of the synchronization unit has a logic low level. On the contrary, in case of (c), (d) and (e), since the input signal does not satisfy the setup time and the hold time, the output signal may have a metastable state or a little transition slope. If such an unstable signal is inputted, the final output signal OUT may have an unstable output value instead of a level of the input signal. Because of such a final output signal OUT, an operation error may occur in a memory system.

SUMMARY

Various exemplary embodiments of the present invention are directed to a semiconductor device for minimizing power consumption and detecting a metastable state of an input signal.

In accordance with an exemplary embodiment of the present invention, a semiconductor device includes a signal detection unit suitable for detecting a state of an input signal and generating a detection signal based on a detected result, and a signal transmission unit suitable for selectively transmitting the input signal in response to the detection signal, wherein the signal detection unit includes a state signal generation unit suitable for detecting a level shifting time of the input signal, and generating a state signal at a detected level shifting time, and a state determination unit suitable for comparing a voltage level of the input signal with a voltage level of a reference voltage in response to the state signal, and outputting the detection signal.

In accordance with another exemplary embodiment of the present invention, a semiconductor device includes a first synchronization unit suitable for synchronizing an input signal with a clock signal and generating a first internal signal, a state signal generation unit suitable for detecting a level shifting time of the input signal, and generating a state signal at a detected level shifting time, a state determination unit suitable for comparing a voltage level of the first internal signal with a voltage level of a reference voltage in response to the state signal, and outputting a detection signal, which indicates a state of the first internal signal, and a signal control unit suitable for transmitting the first internal signal in response to the detection signal.

In accordance with further exemplary embodiment of the present invention, a method for detecting a state of an input signal of a semiconductor device includes detecting a level shifting time of the input signal and generating a state signal at a detected level shifting time, comparing a voltage level of the input signal with a voltage level of a first reference voltage and a voltage level of a second reference voltage in response to the state signal, generating a detection signal when the voltage level of the input signal is higher than the voltage level of the first reference voltage and lower than the voltage level of the second reference voltage, and transmitting selectively the input signal in response to the detection signal.

In accordance with further exemplary embodiment of the present invention, a semiconductor device includes a signal detection unit suitable for generating a detection signal by comparing an input signal with first and second reference voltages, and a signal transmission unit suitable for selectively transmitting the input signal in response to the detection signal, wherein when the input signal has a voltage level higher than the first reference voltage, the input signal is determined to have a logic high level and, wherein when the input signal has a voltage lower than the second reference voltage, the input signal is determined to have a logic low level.

BRIEF DESCRIPTION OF THE DRAWINGS

FIG. 7 is a timing diagram explaining an applicable range of a semiconductor device in accordance with an exemplary embodiment of the present invention.

DETAILED DESCRIPTION

Figure 1A:
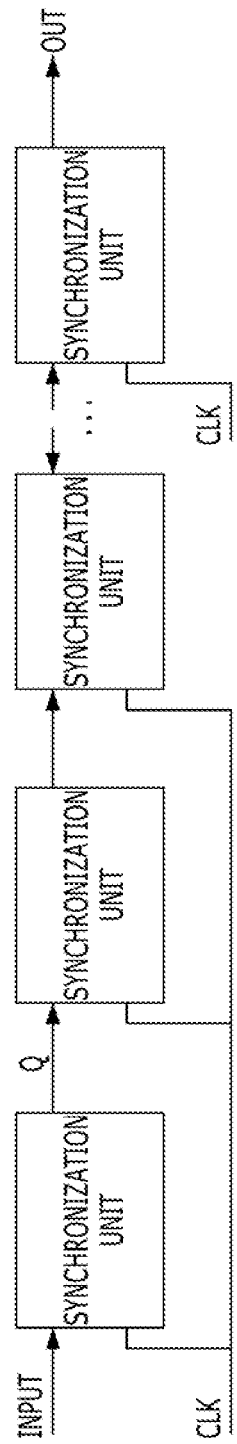
FIG. 1A is a circuit diagram illustrating an output circuit having a plurality of synchronization units.
Figure 1B:
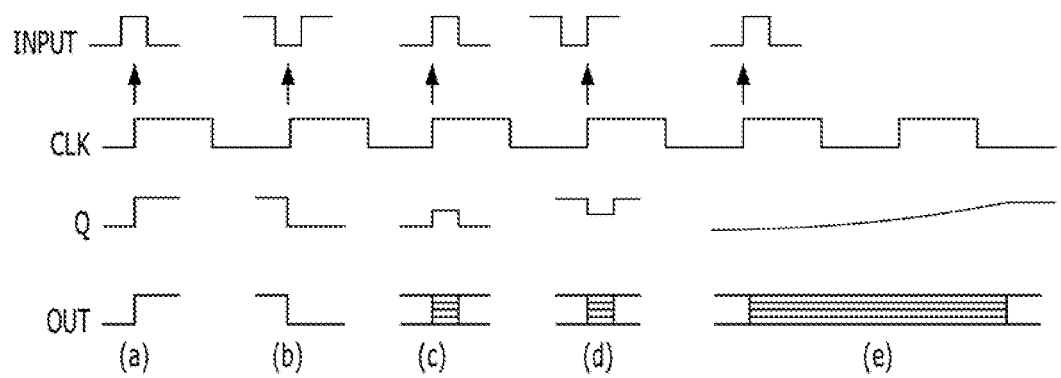
FIG. 1B is a timing diagram explaining a metastable state of the output circuit shown in FIG. 1A.

Various exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' are included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exist or are added.

Figure 2:
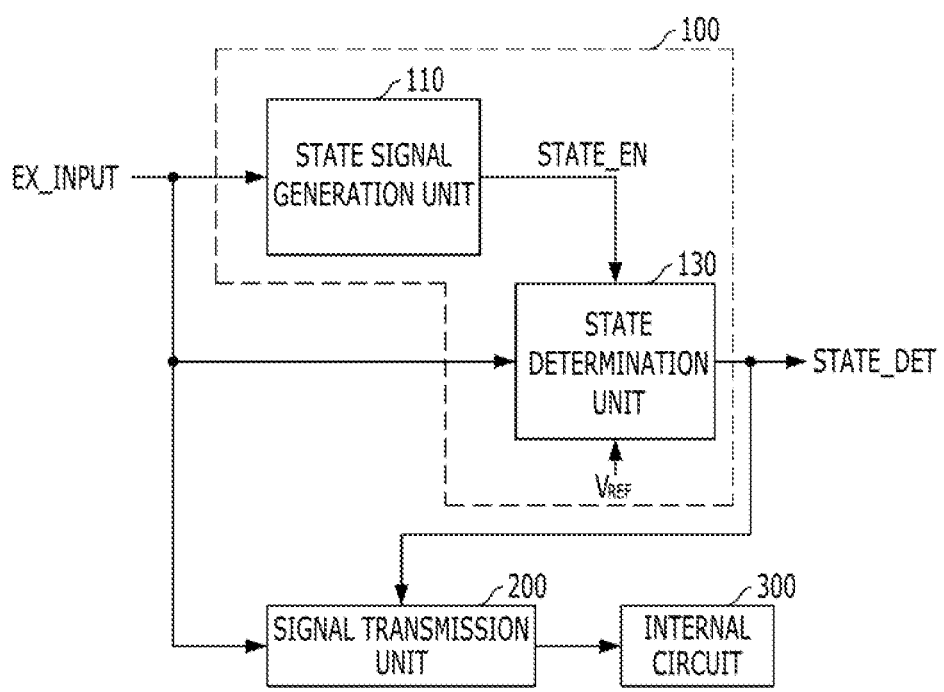
FIG. 2 is a block diagram Illustrating a semiconductor device in accordance with an exemplary embodiment of the present invention.

FIG. 2 is a block diagram illustrating a semiconductor device in accordance with an exemplary embodiment of the present invention.

Referring to FIG. 2, the semiconductor device in accordance with an exemplary embodiment of the present invention includes a signal detection unit 100, a signal transmission unit 200, and an internal circuit 300.

The signal detection unit 100 includes a state signal generation unit 110 and a state determination unit 130.

The state signal generation unit 110 receives an external input signal EX_INPUT, detects a level shift of the external input signal EX_INPUT and generates a state signal STATE_EN. For reference, a metastable state may occur in a shifting/toggling time point of a signal. Thus, the state signal generation unit 110 generates the state signal STATE_EN when a voltage level of the external input signal EX_INPUT is shifted from a logic high level to a logic low level or from the logic low level to the logic high level.

The state determination unit 130 compares a reference voltage level $V_{REF}$ with the voltage level of the external input signal EX_INPUT in response to the state signal STATE_EN received from the state signal generation unit 110, and a metastable detection signal STATE_DET, which indicates a metastable state of the external input signal EX_INPUT.

The signal transmission unit 200 transmits selectively the external input signal EX_INPUT to the internal circuit 300 in response to the metastable detection signal STATE_DET outputted from the state determination unit 130. The signal transmission unit 200 will be described in details with reference to FIG. 3.

An operation of the aforementioned semiconductor device will be described as below. The semiconductor device detects a shifting time point of the external input signal EX_INPUT from the logic high level to the logic low level or from the logic low level to the logic high level, and generates the state signal STATE_EN. If the generated state signal STATE_EN is activated, the semiconductor device compares the reference voltage level $V_{REF}$ with the voltage level of the external input signal EX_INPUT and determines the metastable state of the input signal EX_INPUT. Only when the metastable state is likely to occur, the metastable state of the external input signal EX_INPUT is determined. Thus, power consumption will be reduced when the meta-table state is determined.

Figure 3:
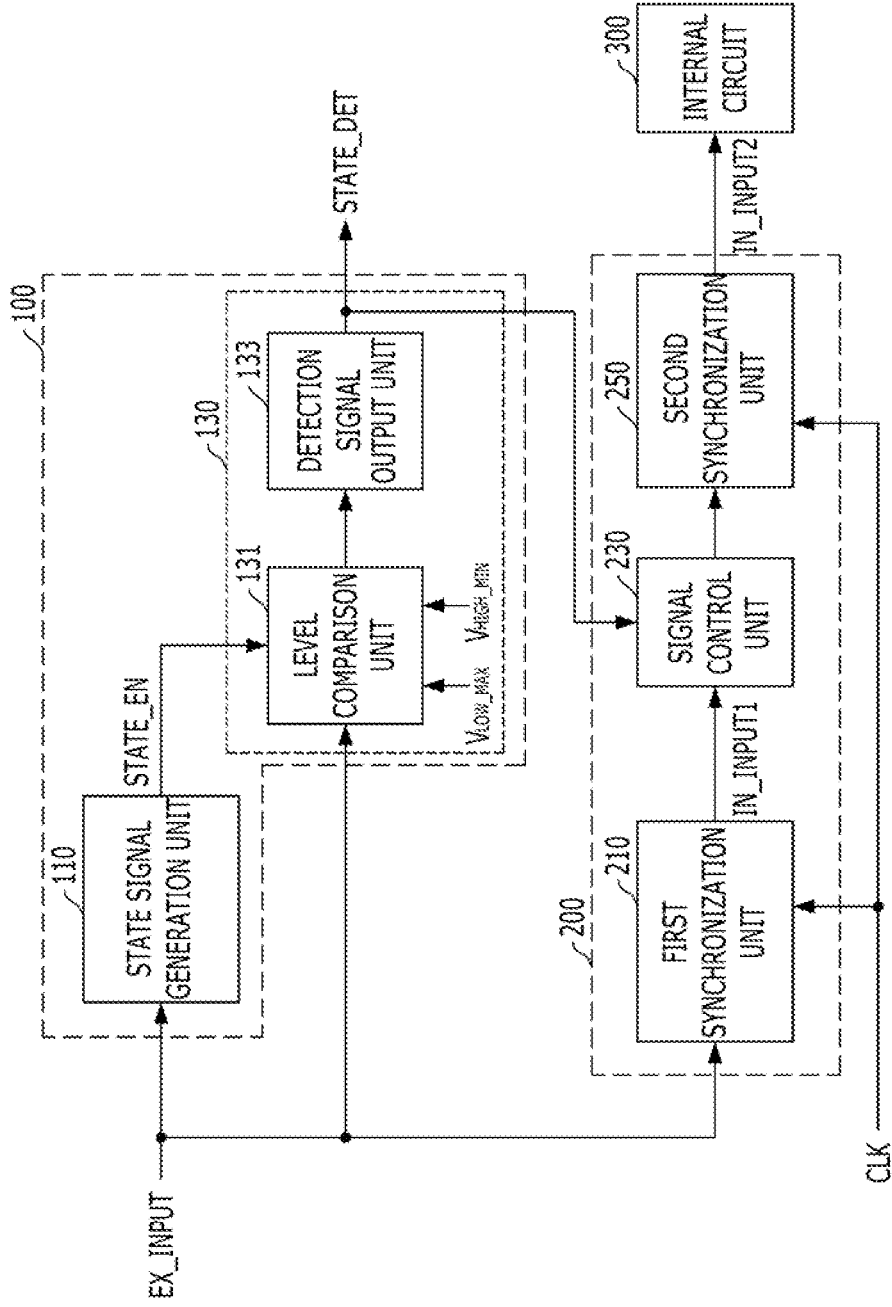
FIG. 3 is a block diagram illustrating in details the semiconductor device shown in FIG. 2.

FIG. 3 is a block diagram illustrating in details the semiconductor device shown in FIG. 2.

Referring to FIG. 3, the semiconductor device includes a signal detection unit 100, a signal transmission unit 200 and an internal circuit 300.

The signal detection unit 100 includes a state signal generation unit 110 and a state determination unit 130.

The state signal generation unit 110 receives an external input signal EX_INPUT, detects a level shifting time of the external input signal EX_INPUT and generates a state signal STATE_EN.

The state determination unit 130 includes a level comparison unit 131 and a detection signal output unit 133. The state determination unit 130 compares a voltage level of the external input signal EX_INPUT with a maximum level $V_{LOW\_MAX}$ of a first reference voltage and a minimum level $V_{HIGH\_MIN}$ of a second reference voltage and outputs a metastable detection signal STATE_DET, which indicates a metastable state of the external input signal EX_INPUT.

The level comparison unit 131 compares the external input signal EX_INPUT with the first reference voltage $V_{LOW\_MAX}$ and the second reference voltage $V_{HIGH\_MIN}$. The detection signal output unit 133 outputs the metastable detection signal STATE_DET when a voltage level of the external input signal EX_INPUT is higher than the first reference voltage $V_{LOW\_MAX}$, or lower than the second reference voltage $V_{HIGH\_MIN}$.

The signal transmission unit 200 transmits selectively the external input signal EX_INPUT to the internal circuit 300 in response to the metastable detection signal STATE_DET outputted from the detection signal output unit 133. The signal transmission unit 200 may include a synchronization unit having a first synchronization unit 210 and a second synchronization unit 250, and a signal control unit 230. That is, since an internal signal is generated through the synchronization unit by synchronizing the external input signal EX_INPUT with a clock signal, the internal signal, which is synchronized with the clock signal CLK, is used in the internal circuit 300.

The first synchronization unit 210 synchronizes the external input signal EX_INPUT with the clock signal CLK and generates a first internal signal IN_INPUT1. The signal control unit 230 receives the first internal signal IN_INPUT1 and controls a transmission of the first internal signal IN_INPUT1 in response to the metastable detection signal STATE_DET1. The second synchronization unit 250 synchronizes the first internal signal IN_INPUT1 outputted from the signal control unit 230 with the clock signal, and generates a second internal signal IN_INPUT2 to be transmitted to the internal circuit 300.

The first and second synchronization units 210 and 250 may have D-flip-flops (not shown). The D-flip-flops may include a data terminal, a clock terminal and an output terminal. For simple descriptions, the D-flip-flops are described as an example.

Hereinafter, an operation of the semiconductor device will be described as below.

The state signal generation unit 110 detects a level shifting time of the external input signal EX_INPUT received from the external device. The state signal generation unit 110 generates the state signal STATE_EN, which indicates a time point when the external input signal EX_INPUT is shifted to a logic high level or a logic low level. The state signal STATE_EN is transmitted to the level comparison unit 131. The voltage level of the external input signal EX_INPUT is compared with the first reference voltage $V_{LOW\_MAX}$ and the second reference voltage $V_{HIGH\_MIN}$ in response to the state signal STATE_EN. If the voltage level of the external input signal EX_INPUT is higher than the first reference voltage $V_{LOW\_MAX}$, or is lower than the second reference voltage $V_{HIGH\_MIN}$, the metastable detection signal STATE_DET is activated. If the voltage level of the external input signal EX_INPUT is lower than the first reference voltage $V_{LOW\_MAX}$, or is higher than the second reference voltage $V_{HIGH\_MIN}$, the metastable detection signal STATE_DET is inactivated. The activated metastable detection signal STATE_DET is transmitted to the signal transmission unit 200. The signal control unit 230 does not transmit the first internal signal IN_INPUT1 to the second synchronization unit 250 in response to the activated metastable detection signal STATE_DET.

If the semiconductor device in accordance with the exemplary embodiment of the present invention receives the external input signal EX_INPUT, which is used in a semiconductor system, the semiconductor device may determine the metastable state of the external input signal EX_INPUT, and prevent an operation error of the semiconductor device caused by an unstable state or input time of the external input signal EX_INPUT.

The metastable state of the external input signal EX_INPUT will be described in details with reference to FIG. 4.

Figure 4:
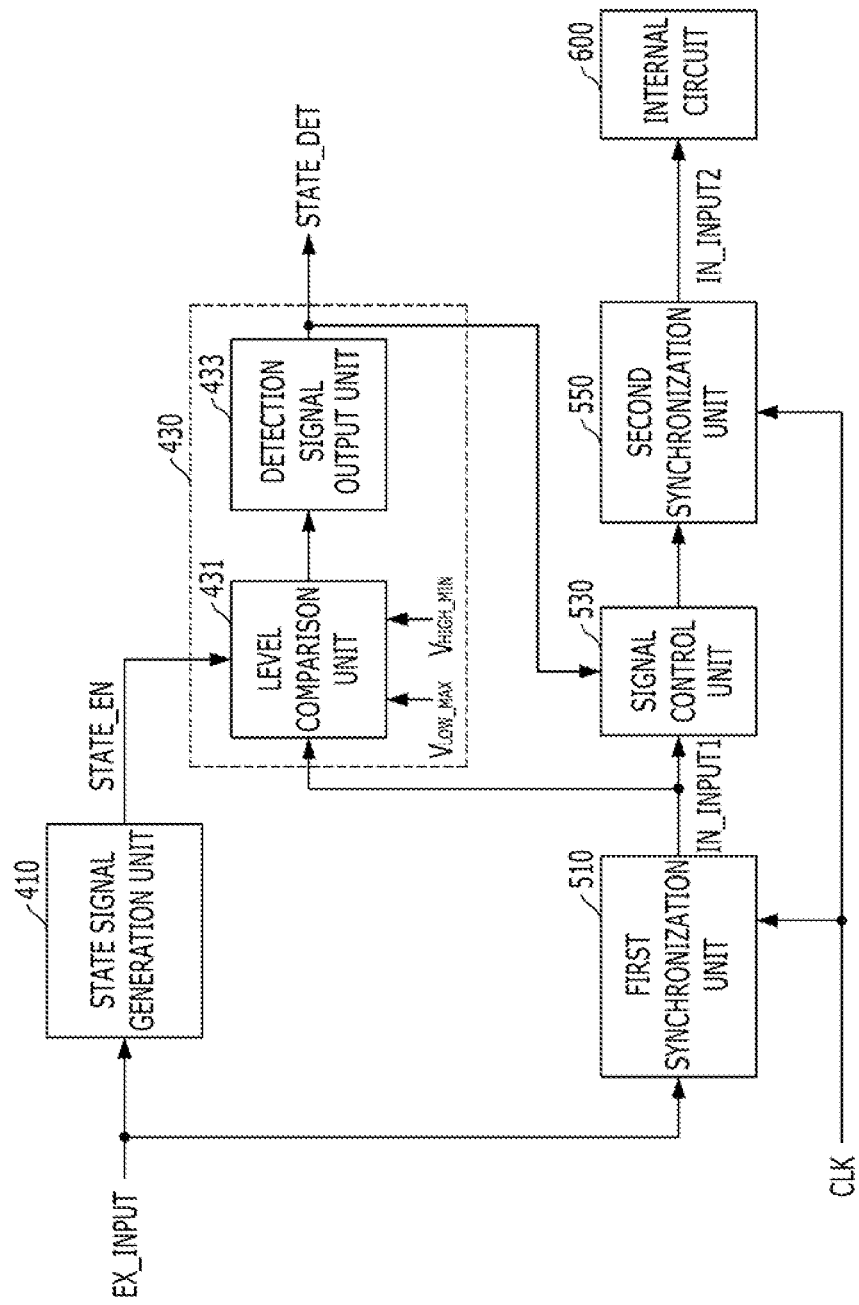
FIG. 4 is a block diagram illustrating a semiconductor device in accordance with another exemplary embodiment of the present invention.

FIG. 4 is a block diagram illustrating a semiconductor device in accordance with another exemplary embodiment of the present invention.

Referring to FIG. 4, a semiconductor device determines a metastable state of a first internal signal IN_INPUT1, which is generated by synchronizing an external input signal EX_INPUT with a clock signal CLK, and transmits the fist internal signal IN_INPUT1 to an internal circuit 600. The semiconductor device includes a state signal generation unit 410, a state determination unit 430, a first synchronization unit 510, a signal control unit 530, a second synchronization unit 550 and the internal circuit 600.

The first synchronization unit 510 synchronizes the external input signal IN_INPUT with the clock signal CLK and generates the first internal signal IN_INPUT1. The state signal generation unit 410 receives the external input signal EX_INPUT, detects a level shifting time of the external input signal EX_INPUT, and generates the state signal STATE_EN. For reference, a metastable state is likely to occur in a shifting/toggling time point of a signal. Thus, the state signal generation unit 410 generates the state signal STATE_EN when a voltage level of the external input signal EX_INPUT is shifted from a logic high level to a logic low level or from the logic low level to the logic high level.

The state determination unit 430 compares the voltage level of the first internal signal IN_INPUT1 with a first reference voltage $V_{LOW\_MAX}$ and a second reference voltage $V_{HIGH\_MIN}$, and outputs a metastable detection signal STATE_DET, which indicates the metastable state of the first internal signal IN_INPUT1. The state determination unit 430 includes a level comparison unit 431 and a detection signal output unit 433.

The level comparison unit 431 compares the voltage level of the first internal signal IN_INPUT1 with a maximum voltage level of the first reference voltage $V_{LOW\_MAX}$ and a minimum voltage level of the second reference voltage $V_{HIGH\_MIN}$. The detection signal output unit 433 outputs the metastable detection signal STATE_DET when the voltage level of the first internal signal IN_INPUT1 is higher than the first reference voltage $V_{LOW\_MAX}$ or is lower than the second reference voltage $V_{HIGH\_MIN}$.

The signal control unit 530 transmits the first internal signal IN_INPUT to the internal circuit 600 in response to the metastable detection signal STATE_DET.

The second synchronization unit 550 synchronizes the first internal signal IN_INPUT1 outputted from the signal control unit 530 with the clock signal CLK, and generates a second internal signal IN_INPUT2 to be transmitted to the internal circuit 600.

Hereinafter, an operation of the semiconductor device will be described as below.

The external input signal EX_INPUT is transmitted to the first synchronization unit 510, and the first internal signal IN_INPUT1 is generated by synchronizing the external input signal EX_INPUT with the clock signal CLK at the first synchronization unit 510. The level shifting time of the external input signal EX_INPUT is detected to determine the metastable sate of the first internal signal IN_INPUT1 at the state signal generation unit 410. The state signal generation unit 410 receives the external input signal EX_INPUT and generates the state signal STATE_EN, which indicates a shifting time when the external input signal EX_INPUT is shifted to a logic low level or a logic high level. The state signal STATE_EN is transmitted to the level comparison unit 431.

The comparison unit 431 compares the voltage level of the first internal signal IN_INPUT1 with the first reference voltage level $V_{LOW\_MAX}$ and the second reference voltage level $V_{HIGH\_MIN}$ in response to the state signal STATE_EN. If the voltage level of the first internal signal IN_INPUT1 is detected between the maximum voltage level $V_{LOW\_MAX}$ of the first reference voltage and the minimum voltage level $V_{HIGH\_MIN}$ of the second reference voltage, the detection signal output unit 433 generates the metastable detection signal STATE_DET.

The metastable detection signal STATE_DET is provided to the signal control unit 530. If the metastable detection signal STATE_DET is activated, the signal control unit 530 determines that the first internal signal IN_INPUT1 is the metastable state as an unstable signal, and the signal control unit 530 does not transmit the first internal signal IN_INPUT1 to the second synchronization unit 550. If the metastable detection signal STATE_DET is inactivated, the signal control unit 530 determines that the first internal signal IN_INPUT1 is not the metastable state, and the signal control unit 530 transmits the first internal signal IN_INPUT1 to the second synchronization unit 550.

The second synchronization unit 550 synchronizes the first internal signal IN_INPUT1 as a stable signal with the clock signal CLK, generates the second internal signal IN_INPUT2 to be transmitted to the internal circuit 600.

As described above, the semiconductor device generates the internal signal by synchronizing the external input signal EX_INPUT with the clock signal CLK, and determines the metastable state of the internal signal before it is transmitted to a next synchronization unit. Thus, the semiconductor device does not apply an error signal as the unstable signal to the next synchronization unit.

Figure 5:
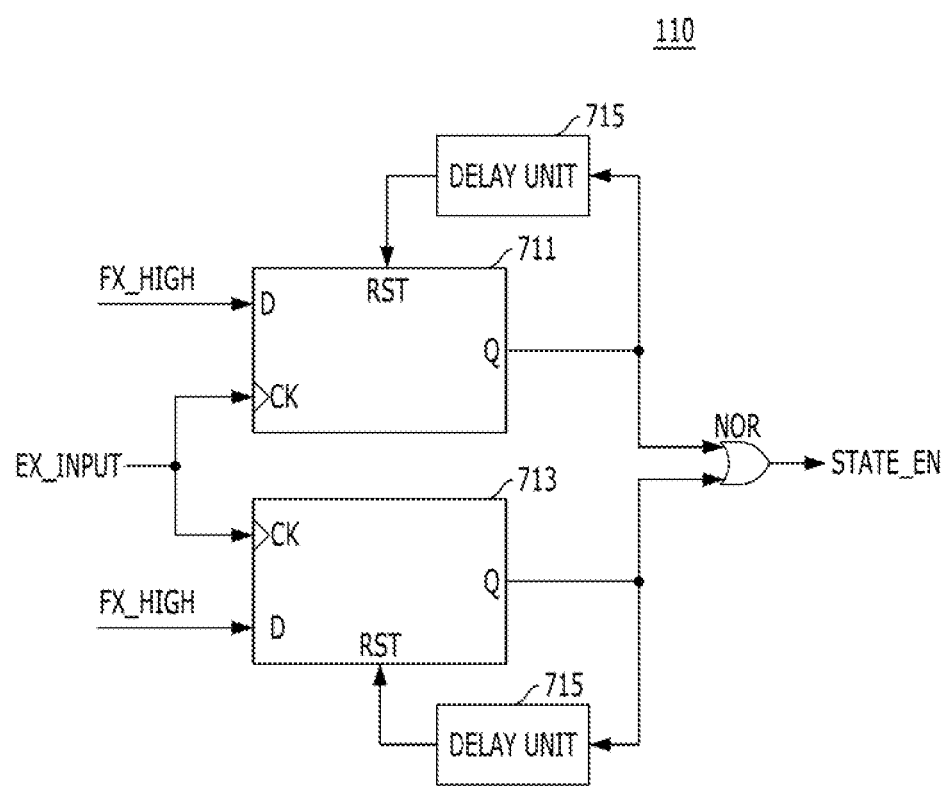
FIG. 5 is a circuit diagram illustrating a state signal generation unit shown in FIGS. 2 and 4.

FIG. 5 is a circuit diagram illustrating a state signal generation unit shown in FIGS. 2 and 4.

Referring to FIG. 5, since the state signal generation unit 110 shown in FIG. 2 is same as the state signal generation unit 410 shown in FIG. 4, the state signal generation unit 110 shown in FIG. 2 will be exemplarily described in details with reference to FIG. 5.

The state signal generation units 110 includes a rising-edge triggered flip-flop 711, a falling-edge triggered flip-flop 713, delay units 715 and a NOR logic gate NOR.

The rising-edge triggered flip-flop 711 and the falling-edge triggered flip-flop 713 each includes a data terminal D, a clock terminal CLK an output terminal Q and a reset terminal RST. The rising-edge triggered flip-flop 711 receives a fixed signal FX_HIGH having a high logic level through the data terminal D, synchronizes the fixed signal FX_HIGH with the external input signal EX_INPUT received from the clock terminal CLK, and transmits the synchronized signal having the high logic level to the output terminal Q. That is, the rising-edge triggered flip-flop 711 outputs the fixed signal FX_HIGH having the high logic level to the output terminal Q, in synchronization with the rising edge of the external input signal EX_INPUT.

The falling-edge triggered flip-flop 713 receives the fixed signal FX_HIGH having the high logic level through the data terminal D, synchronizes the fixed signal FX_HIGH with the external input signal EX_INPUT received from the clock terminal CLK, and transmits the synchronized signal having the high logic level to the output terminal Q. That is, the falling-edge triggered flip-flop 713 outputs the fixed signal FX_HIGH having the high logic level to the output terminal Q, in synchronization with the falling edge of the external input signal EX_INPUT. An output signal of the rising-edge triggered flip-flop 711 and an output signal of the falling-edge triggered flip-flop 713 are transmitted to the NOR gate NOR. If the output signal of the rising-edge triggered flip-flop 711 has a low logic level, and the output signal of the falling-edge triggered flip-flop 731 has a low logic level, the NOR gate NOR outputs the state signal STATE_EN having a high logic level.

The delay units 715 delay the output signals of the rising-edge triggered flip-flop 711 and the falling-edge triggered flip-flop 713 by a predetermined amount and transmit the delayed output signals to the reset terminals RST. The rising-edge triggered flip-flop 711 and the falling-edge triggered flip-flop 713 are reset in response to the delayed output signals of the rising-edge triggered flip-flop 711 and the falling-edge triggered flip-flop 713. The reset time of the rising-edge triggered flip-flop 711 and the falling-edge triggered flip-flop 713 are set by adjusting a delay amount of the delay units 715. Thus, the activation time of the state signal STATE_EN may be adjusted by setting the reset time of the rising-edge triggered flip-flop 711 and the falling-edge triggered flip-flop 713.

Figure 6:
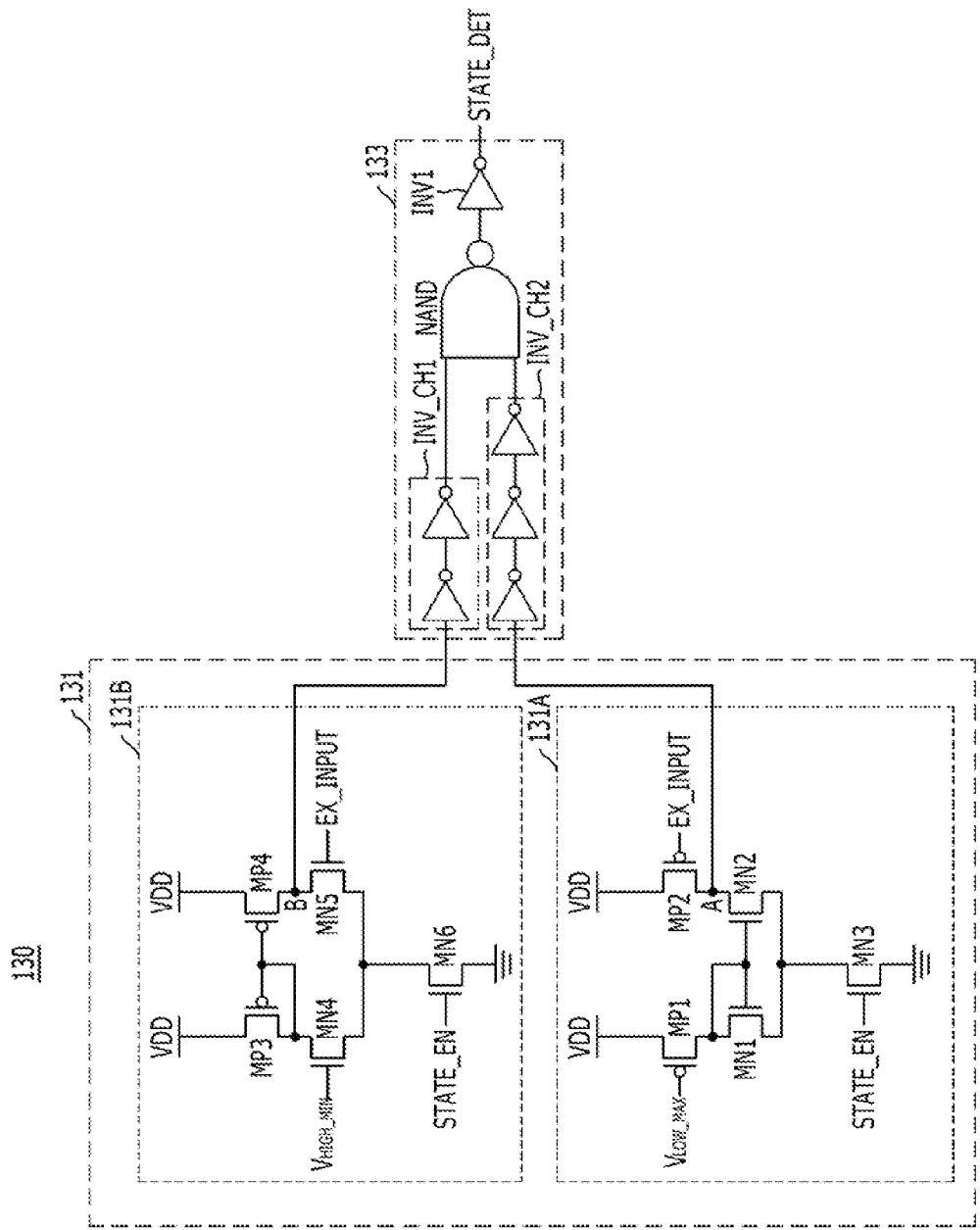
FIG. 6 is a circuit diagram illustrating a state determination unit shown in FIGS. 2 and 4.

FIG. 6 is a circuit diagram illustrating a state determination unit shown in FIGS. 2 and 4.

Referring to FIG. 6, since the state determination unit 130 shown in FIG. 2 is same as the state determination unit 430 shown in FIG. 4, the state determination unit 130 shown in FIG. 2 will be exemplarily described in details with reference to FIG. 6.

The state determination unit 130 includes the level comparison unit 131 and the detection signal output unit 133. The level comparison unit 131 includes a first comparison unit 131A for comparing the voltage level of the input signal EX_INPUT with the maximum voltage level $V_{LOW\_MAX}$ of the first voltage, and a second comparison unit 131B for comparing the voltage level of the input signal EX_INPUT with the minimum voltage level $V_{HIGH\_MIN}$ of the second voltage. Herein, the input signal EX_INPUT indicates the external input signal EX_INPUT shown in FIG. 2 or the first internal signal IN_INPUT1 shown in FIG. 4 for determining the metastable state thereof.

The first comparison unit 131A includes a first PMOS transistor MP1, a second PMOS transistor MP2, a first NMOS transistor MN1, a second NMOS transistor MN2 and a third NMOS transistor MN3. The first PMOS transistor MP1, the second PMOS transistor MP2, the first NMOS transistor MN1 and the second NMOS transistor MN2 form a source-drain path between a power supply voltage VDD and the third NMOS transistor MN3, and have a current mirror structure. The third NMOS transistor MN3 forms a source-drain path between the first and second NMOS transistors MN1 and MN2 and the ground voltage VSS, and has a gate for receiving the state signal STATE_EN.

The first PMOS transistor MP1 receives the maximum voltage level $V_{LOW\_MAX}$ of the first voltage through a gate thereof, and the second PMOS transistor MP2 receives the input signal EX_INPUT through a gate thereof. A gate of the first NMOS transistor MN1 and a gate of the second NMOS transistor MN2 are coupled to a drain of the first PMOS transistor MP1. A first output node A is coupled between the second PMOS transistor MP2 and the second NMOS transistor MN2.

Since the first comparison unit 131A has a current mirror structure, when the state signal STATE_EN is activated, a current path is formed between the power supply voltage VDD and the ground voltage in response to the input signal EX_INPUT and the maximum voltage level $V_{LOW\_MAX}$ of the first voltage. Herein, the voltage level of the first output node A is determined by a current, which flows on the current path in response to the input signal EX_INPUT and the maximum voltage level $V_{LOW\_MAX}$ of the first voltage.

If the voltage level of the input signal EX_INPUT is higher than the maximum voltage level $V_{LOW\_MAX}$ of the first voltage, a low logic level is outputted through the first output node A. If the voltage level of the input signal EX_INPUT is lower than the maximum voltage level $V_{LOW\_MAX}$ of the first voltage, a high logic level is outputted through the first output node A.

The second comparison unit 131B includes a third PMOS transistor MP3, a fourth PMOS transistor MP4, a fourth NMOS transistor MN4, a fifth NMOS transistor MN5 and a sixth NMOS transistor MN6.

The third PMOS transistor MP3, the fourth PMOS transistor MP4, the fourth NMOS transistor MN4 and the fifth NMOS transistor MN5 form a source-drain path between the power supply voltage VDD and the sixth NMOS transistor MN6, and have a current mirror structure.

The sixth NMOS transistor MN6 forms a source-drain path between the fourth and fifth NMOS transistors MN4 and MN5 and the ground voltage VSS, and receives the state signal STATE_EN through a gate thereof.

The fourth NMOS transistor MN4 receives the minimum voltage level $V_{HIGH\_MIN}$ of the second voltage through a gate thereof, and the fifth NMOS transistor MN5 receives the input signal EX_INPUT through a gate thereof. A gate of the third PMOS transistor MP3 and a gate of the fourth PMOS transistor MP4 are coupled to a drain of the third PMOS transistor MP3. A second output node B is coupled between the fourth PMOS transistor MP4 and the fifth NMOS transistor MN5.

Since the second comparison unit 131B has a current mirror structure, when the state signal STATE_EN is activated, a current path is formed between the power supply voltage VDD and the ground voltage in response to the input signal EX_INPUT and the minimum voltage level $V_{HIGH\_MIN}$ of the second voltage. Herein, the voltage level of the second output node B is determined by a current, which flows on the current path in response to the input signal EX_INPUT and the minimum voltage level $V_{HIGH\_MIN}$ of the second voltage.

If the voltage level of the input signal EX_INPUT is higher than the minimum voltage level $V_{HIGH\_MIN}$ of the second voltage, a low logic level is outputted through the second output node B. If the voltage level of the input signal EX_INPUT is lower than the minimum voltage level $V_{HIGH\_MIN}$ of the second voltage, a high logic level is outputted through the second output node B.

The detection signal output unit 133 receives the output signal of the first comparison unit 131A through the first output node A and the output signal of the second comparison unit 131B through the second output node B. The output signal of the first comparison unit 131A is transmitted to a terminal of a NAND gate NAND via a first inverter chain INV_CH1 in which two inverters are coupled serially. The output signal of the second comparison unit 131B is transmitted to the other terminal of the NAND gate NAND via a second inverter chain INV_CH2 in which three inverters are coupled serially.

The NAND gate NAND performs a NAND operation on the output signal of the first inverter chain INV_CH1 and the output signal of the second inverter chain INV_CH2. The output signal of the NAND gate NAND is inverted by an inverter INV1. The inverted output signal as the metastable detection signal STATE_DET is outputted.

Thus, if a low logic level is outputted from the first comparison unit 131A and a high logic level is outputted from the second comparison unit 131B, the state determination unit 130 outputs the metastable detection signal STATE_DET having a high logic level. If a low logic level is outputted from the first comparison unit 131A and a low logic level is outputted from the second comparison unit 131B, the state determination unit 130 outputs the metastable detection signal STATE_DET having a low logic level. If a high logic level is outputted from the first comparison unit 131A and a low logic level is outputted from the second comparison unit 131B, the state determination unit 130 outputs the metastable detection signal STATE_DET having a low logic level. If a high logic level is outputted from the first comparison unit 131A and a high logic level is outputted from the second comparison unit 131B, the state determination unit 130 outputs the metastable detection signal STATE_DET having a low logic level.

For reference, an activation or an inactivation of the metastable detection signal STATE_DET may be changed through different circuit designs.

FIG. 7 is a timing diagram explaining an applicable range of a semiconductor device in accordance with an exemplary embodiment of the present invention.

Referring to FIG. 7, in case of a normal state A, since a voltage level of an input signal INPUT exists between a voltage level of the ground voltage VSS and the maximum voltage level $V_{LOW\_MAX}$ of the first voltage, or between a voltage level of the power supply voltage VDD and the minimum voltage level $V_{HIGH\_MIN}$ of the second voltage, the metastable detection signal STATE_DET is inactivated to a low logic level. In case of the metastable state B, since the voltage level of the input signal INPUT exists between the maximum voltage level $V_{LOW\_MAX}$ of the first voltage and the minimum voltage level $V_{HIGH\_MIN}$ of the second voltage, the metastable detection signal STATE_DET is activated to a high logic level.

As described above, a semiconductor device in accordance with the embodiments of the present invention detects a metastable state of the input signal, and does not transmit the input signal having the metastable state to other circuits or system based on the detected metastable state. Thus, a malfunction of the semiconductor device and a semiconductor system may be prevented by determining the input signal having the metastable state.

Moreover, the semiconductor device may minimize power consumption by detecting a level shifting time when the metastable state of the input signal is likely to occur.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a signal detection unit suitable for detecting a state of an input signal and generating a detection signal based on a detected result; and
a signal transmission unit suitable for selectively transmitting the input signal in response to the detection signal,
wherein the signal detection unit comprises:
a state signal generation unit suitable for detecting a level shifting time of the input signal, and generating a state signal at a detected level shifting time; and
a state determination unit suitable for comparing a voltage level of the input signal with a voltage level of a reference voltage in response to the state signal, and outputting the detection signal.

2. The semiconductor device of claim 1, wherein the reference voltage includes a first reference voltage and a second reference voltage;
the input signal shifts between first and second voltages; and
the detection signal is activated when the input signal is detected in an intermediate range between the first and second reference voltages and the state thereof is detected as a metastable state.

3. The semiconductor device of claim 2, wherein when the input signal has a voltage level higher than the first reference voltage, the input signal is determined to have a logic high level and wherein when the input signal has a voltage lower than the second reference voltage, the input signal is determined to have a logic low level.

4. The semiconductor device of claim 3, wherein the state determination unit comprises:
a level comparison unit suitable for comparing the voltage level of the input signal with the first reference voltage and the second reference voltage; and
a detection signal output unit suitable for outputting the detection signal in response to an output signal of the level comparison unit.

5. The semiconductor device of claim 4, wherein the level comparison unit comprises:
a first comparison unit suitable for comparing the voltage level of the input signal with the first reference voltage; and
a second comparison unit suitable for comparing the voltage level of the input signal with of the second reference voltage.

6. The semiconductor device of claim 5, wherein the detection signal output unit activates the detection signal when the voltage level of the input signal is higher than the first reference voltage and lower than the second reference voltage, and the detection signal output unit inactivates the detection signal when the voltage level of the input signal is lower than the first reference voltage, or the voltage level of the input signal is higher than the second reference voltage.

7. The semiconductor device of claim 1, wherein the signal transmission unit comprises:
a first synchronization unit suitable for synchronizing the input signal with a clock signal and generating a first internal signal; and
a signal control unit suitable for transmitting the first internal signal to an internal circuit of the semiconductor device in response to the detection signal.

8. The semiconductor device of claim 7, wherein the signal transmission unit further comprises:
a second synchronization unit suitable for synchronizing a signal outputted from the signal control unit with the clock signal, generating a second internal signal, and transmitting the second internal signal to an internal circuit of the semiconductor device.

9. A semiconductor device, comprising:
a first synchronization unit suitable for synchronizing an external input signal with a clock signal and generating a first internal signal;
a state signal generation unit suitable for detecting a level shifting time of the external input signal, and generating a state signal at a detected level shifting time;
a state determination unit suitable for comparing a voltage level of the first internal signal with a voltage level of a reference voltage in response to the state signal, and outputting a detection signal, which indicates a state of the first internal signal; and
a signal control unit suitable for transmitting the first internal signal in response to the detection signal.

10. The semiconductor device of claim 9,
wherein the reference voltage includes a first reference voltage and a second reference voltage;
the external input signal shifts between first and second voltages; and
the detection signal is activated when the external input signal is detected in an intermediate range between the first and second reference voltages and the state thereof is detected as a metastable state.

11. The semiconductor device of claim 10, wherein when the first internal input signal has a voltage level higher than the first reference voltage, the first internal input signal is determined to have a logic high level and wherein when the input signal has a voltage lower than the second reference voltage, the first internal input signal is determined to have a logic low level.

12. The semiconductor device of claim 9, wherein the state determination unit comprises:
a level comparison unit suitable for comparing the voltage level of the first internal signal with the first reference voltage and the second reference voltage; and
a detection signal output unit suitable for outputting the detection signal in response to an output signal of the level comparison unit.

13. The semiconductor device of claim 12, wherein the level comparison unit comprises:
a first comparison unit suitable for comparing the voltage level of the first internal signal with the first reference voltage; and
a second comparison unit suitable for comparing the voltage level of the first internal signal with of the second reference voltage.

14. The semiconductor device of claim 12, wherein the detection signal output unit activates the detection signal when the voltage level of the first internal signal is higher than the first reference voltage and lower than the second reference voltage, and the detection signal output unit inactivates the detection signal when the voltage level of the first internal signal is lower than the first reference voltage, or the voltage level of the first internal signal is higher than the second reference voltage.

15. The semiconductor device of claim 9, further comprising:
a second synchronization unit suitable for synchronizing a signal outputted from the signal control unit with the clock signal, generating a second internal signal, and transmitting the second internal signal to an internal circuit of the semiconductor device.

16. A method for detecting a state of an input signal of a semiconductor device, comprising:
detecting a level shifting time of the input signal, and generating a state signal at a detected level shifting time;
comparing a voltage level of the input signal with a voltage level of a first reference voltage and a voltage level of a second reference voltage in response to the state signal;
generating a detection signal when the voltage level of the input signal is higher than the voltage level of the first reference voltage and lower than the voltage level of the second reference voltage; and
transmitting selectively the input signal in response to the detection signal.

17. The method of claim 16, wherein when the input signal has a voltage level higher than the first reference voltage, the input signal is determined to have a logic high level and wherein when the input signal has a voltage lower than the second reference voltage, the input signal is determined to have a logic low level.

18. A semiconductor device, comprising:
a signal detection unit suitable for generating a detection signal by comparing an input signal with first and second reference voltages; and
a signal transmission unit suitable for selectively transmitting the input signal in response to the detection signal,
wherein when the input signal has a voltage level higher than the first reference voltage, the input signal is determined to have a logic high level and,
wherein when the input signal has a voltage lower than the second reference voltage, the input signal is determined to have a logic low level,
wherein the signal transmission unit comprises:
a synchronization unit suitable for synchronizing the input signal with a clock signal and generating an internal signal; and
a signal control unit suitable for controlling the internal signal to be selectively transmitted in response to the detection signal.

* * * * *